United States Patent
Chan et al.

(10) Patent No.: US 10,211,831 B1
(45) Date of Patent: Feb. 19, 2019

(54) IMPEDANCE CALIBRATION DEVICE AND METHOD THEREOF

(71) Applicant: REALTEK SEMICONDUCTOR CORP., Hsinchu (TW)

(72) Inventors: Cheng-Pang Chan, Hsinchu (TW); Chien-Ming Wu, Hsinchu County (TW); Liang-Huan Lei, Kaohsiung (TW); Jian-Ru Lin, Nantou County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/985,653

(22) Filed: May 21, 2018

(30) Foreign Application Priority Data

Aug. 18, 2017 (TW) .............................. 106128108 A (51) Int. Cl.
| | |
|---|---|
| *H03K 19/00* | (2006.01) |
| *H03K 19/0175* | (2006.01) |
| *H04L 25/02* | (2006.01) |

(52) U.S. Cl.
CPC . *H03K 19/0005* (2013.01); *H03K 19/017545* (2013.01); *H04L 25/0278* (2013.01); *H04L 25/0298* (2013.01)

(58) Field of Classification Search
CPC ........ H03K 19/0005; H03K 19/017545; H04L 25/0278; H04L 25/0298

USPC ............................................................ 326/30
See application file for complete search history.

(56) References Cited

U.S. PATENT DOCUMENTS

| | | | | |
|---|---|---|---|---|
| 9,369,128 B1 * | 6/2016 | Tan | ..................... | H03K 19/0005 |
| 2011/0241653 A1 * | 10/2011 | Kim | .................... | H03K 19/0005 |
| | | | | 324/76.83 |
| 2014/0325135 A1 * | 10/2014 | Anderson | .......... | H03K 19/0005 |
| | | | | 711/105 |
| 2017/0331476 A1 * | 11/2017 | Cho | .................... | H03K 19/0005 |

* cited by examiner

*Primary Examiner* — Daniel D Chang
(74) *Attorney, Agent, or Firm* — Li & Cai Intellectual Property (USA) Office (57) ABSTRACT

An impedance calibration device provided includes a timing device, a first transmitter, a first variable resistor, a second variable resistor and a first receiver. The first variable resistor is used to receive a first adjustment code. The second variable resistor is used to receive a second adjustment code. The first receiver generates a first contact digital signal according to a first contact voltage. The first receiver generates a first terminate digital signal according to a first terminate voltage and the first adjustment code. The first receiver generates a first load digital signal according to a load voltage and the second adjustment. The timing device dynamically adjust the first adjustment code and the second adjustment code according to the first contact digital signal, the first terminate digital signal and the first load digital signal.

18 Claims, 7 Drawing Sheets

IMPEDANCE CALIBRATION DEVICE AND METHOD THEREOF

FIELD OF THE DISCLOSURE

The present disclosure relates to a calibration device, and in particular to an impedance calibration device and a method thereof.

BACKGROUND OF THE DISCLOSURE

Conventional semiconductor manufacturing processes may cause drifting to occur, and the drifting in the semiconductor processes may result in a change of parameters (for example, impedance, inductance and resistance) of various electronic elements in integrated circuits. In communication systems, the transmitter and the receiver must strictly match each other in impedance, and lack thereof may result in signal distortion or signal loss. While resistances may be modified in the prior art by fine-tuning, and the occurrence of drifting may be reduced by process control, the former would increase test times and costs, and the latter would increase costs associated with integrated circuits.

SUMMARY OF THE DISCLOSURE

The present disclosure provides an impedance calibration device and a method thereof; with the inclusion of a few electronic elements, and with use of adjustment codes to adjust an impedance of a variable resistor by digital-to-analog method, the impedance calibration device can find an optimal impedance matching digital signal.

An embodiment of the present disclosure provides an impedance calibration device having a timing device, a first channel, a first switch, a first contact resistor and a load resistor, the timing device being coupled to the first channel, the load resistor having an end coupled to an end of the first switch, the load resistor having an uncoupled end connected to ground, the first switch having an uncoupled end coupled to an end of the first contact resistor, and the first switch having a load voltage. The impedance calibration device includes a first transmitter; a first variable resistor having an end coupled to the first transmitter and having a first terminate voltage, the first variable resistor being used to receive a first adjustment code, the first contact resistor having an uncoupled end coupled to an uncoupled end of the first variable resistor and having a first contact voltage; and a first receiver having a first input terminal, a second input terminal, a third input terminal and a first output terminal, the first input terminal being coupled to an end of a second switch, the second switch having an uncoupled end connected to the first terminate voltage, the second input terminal being coupled to an end of a third switch, the third switch having an uncoupled end connected to the first contact voltage, the third input terminal used for being coupled to an end of a fourth switch. A second variable resistor has an end used for being coupled to an uncoupled end of the fourth switch, and the second terminate resistor receives a second adjustment code. The first receiver generates a first contact digital signal according to the first contact voltage, the first receiver generates a first terminate digital signal according to the first terminate voltage and the first adjustment code, the first receiver generates a first load digital signal according to the load voltage and the second adjustment code, and the timing device dynamically adjusts the first adjustment code and the second adjustment code according to the first contact digital signal, the first terminate digital signal and the first load digital signal.

An embodiment of the present disclosure provides an impedance calibration method used for an impedance calibration device having a first channel. The impedance calibration device includes a timing device, a first receiver, a first variable resistor, a second variable resistor, a first contact resistor, a load resistor and a first transmitter. The first variable resistor is used to receive a first adjustment code, the second variable resistor is used to receive a second adjustment code, the first receiver has a first input terminal, a second input terminal, a third input terminal and a first output terminal, and the timing device is coupled to the first channel. The first input terminal is used for being coupled to an end of a second switch, the second switch has an uncoupled end connected to a first terminate voltage, the second input terminal is used for being coupled to an end of a third switch, the third switch has an uncoupled end connected to the first contact voltage, and the third input terminal is used for being coupled to an end of a fourth switch. The impedance calibration method includes the steps of: the first receiver generating a first contact digital signal according to the first contact voltage of the first contact resistor; the first receiver generating a first terminate digital signal according to the first terminate voltage of the first variable resistor and the first adjustment code; the first receiver generating a first load digital signal according to a load voltage of the load resistor and the second adjustment code; and the timing device dynamically adjusting the first adjustment code and the second adjustment code according to the first contact digital signal, the first terminate digital signal and the first load digital signal.

To further understand the techniques, means and effects of the present disclosure, the following detailed descriptions and appended drawings are hereby referred to, such that, and through which, the purposes, features and aspects of the present disclosure can be thoroughly and concretely appreciated. However, the appended drawings are provided solely for reference and illustration, without any intention to limit the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION OF THE EXEMPLARY EMBODIMENTS

Embodiments of an impedance calibration device and method thereof according to the present disclosure are described herein. Other advantages and objectives of the present disclosure can be easily understood by one skilled in the art from the disclosure. The present disclosure can be applied in different embodiments. Various modifications and variations can be made to various details in the description for different applications without departing from the scope of the present disclosure. The drawings of the present disclosure are provided only for simple illustrations, but are not drawn to scale and do not reflect the actual relative dimensions. The following embodiments are provided to describe in detail the concept of the present disclosure, and are not intended to limit the scope thereof in any way.

A mass-production test apparatus generally has a terminate resistor, a contact resistor and a load resistor for testing electrical parameters of a circuit. The terminate resistor, the contact resistor and the load resistor are connected in serial, and respectively have a terminate voltage, a contact voltage and a load voltage. The terminate resistor is a variable resistor. The load resistor is set to be about 50Ω, the contact resistor is set to be about 0Ω. When the terminate resistor equals the load resistor, a sum of the contact voltage and the load voltage equals the terminate voltage to achieve an impedance match. An embodiment below describes that the present disclosure allocates at least a transmitter, at least a receiver, multiple switches and multiple variable resistors in an impedance calibration device to achieve automatic impedance calibration by an analog-to-digital method.

Figure 1:
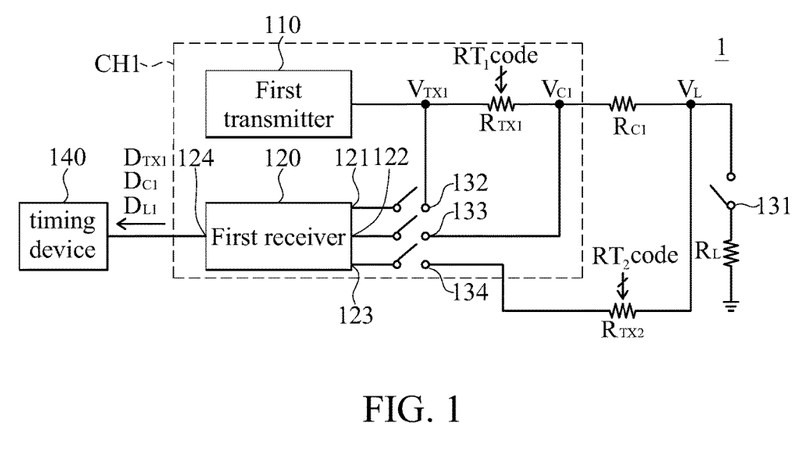
FIG. 1 shows a circuit diagram of an impedance calibration device according to an embodiment of the present disclosure.

Reference is made to FIG. 1, which shows a circuit diagram of an impedance calibration device according to an embodiment of the present disclosure. An impedance calibration device 1 includes a timing device 140, a first transmitter 110, a first receiver 120, a first switch 131, a second switch 132, a third switch 133, a fourth switch 134, a first variable resistor $R_{TX1}$, a second variable resistor $R_{TX2}$, a first the contact resistor $R_{C1}$ and a load resistor $R_L$. The first receiver 120 further includes a first input terminal 121, a second input terminal 122, a third input terminal 123 and a first output terminal 124. The impedance calibration device 1 has a first channel CH1. The timing device 140 is coupled to the first channel CH1.

The first variable resistor $R_{TX1}$ has an end coupled to the first transmitter 110 and has a first terminate voltage $V_{TX1}$. The first variable resistor $R_{TX1}$ is used to receive a first adjustment code $RT_1$code to adjust an impedance of the first variable resistor $R_{TX1}$. The first the contact resistor $R_{C1}$ has an end coupled to an uncoupled end of the first variable resistor $R_{TX1}$, and has a first contact voltage $V_{C1}$. The first switch 131 has an end used for being coupled to an uncoupled end of a contact resistor $R_{C1}$ and a load voltage $V_L$ is across the first switch 131. The load resistor $R_L$ has an end used for being coupled to an uncoupled end of the first switch 131, an uncoupled end of the load resistor $R_L$ is connected to ground. The first input terminal 121 is used for being coupled to an end of the second switch 132, an uncoupled end of the second switch 132 is connected to the first terminate voltage $V_{TX1}$. The second input terminal 122 is used for being coupled to an end of the third switch 133, an uncoupled end of the third switch 133 is connected to the first contact voltage $V_{C1}$. The third input terminal 123 is coupled to an end of the fourth switch 134. The second variable resistor $R_{TX2}$ has an end used for being coupled to an uncoupled end of the fourth switch 134, the second variable resistor $R_{TX2}$ is used to receive a second adjustment code $RT_2$code to adjust an impedance of the second variable resistor $R_{TX2}$.

When the third switch 133 is enabled, and the second switch 132 and the fourth switch 134 are opened, the first receiver 120 generates and outputs a first contact digital signal $D_{C1}$ to the first output terminal 124 according to the first contact voltage VC1. When the third switch 133 is enabled, and the first switch 131, the second switch 132 and the fourth switch 134 are opened, the first receiver 120 generates a first terminate digital signal $D_{TX1}$ according to the first terminate voltage $V_{TX1}$ and the first adjustment code $RT_1$code.

The first switch 131 is opened to form an open circuit with the load resistor $R_L$, the first adjustment code $RT_1$code can adjust the impedance of the first variable resistor $R_{TX1}$ to be 0, at which time the first terminate voltage $V_{TX1}$ equals the first contact voltage $V_{C1}$, and the third switch 133 of the first receiver 120 is connected to the first terminate voltage $V_{TX1}$. The first receiver 120 may be an analog to digital convertor converting an analog signal of the first terminate voltage $V_{TX1}$ into the first terminate digital signal $D_{TX1}$.

When the fourth switch 134 is enabled, and the second switch 132 and the third switch 133 are opened, the first receiver 120 generates a first load digital signal $D_{L1}$ according to the load voltage VL and the second adjustment code RT2code. Furthermore, the second switch 132 is opened to form an open circuit with the first variable resistor $R_{TX1}$, the third switch 133 is opened to form an open circuit with the first contact resistor $R_{C1}$, the second adjustment code $RT_2$code can adjust an impedance of the second variable resistor $R_{TX2}$ to be 0, at which time the load voltage $V_{L1}$ equals the fourth switch 134, and the fourth switch 134 of the first receiver 120 is connected to the load voltage $V_{L1}$. The first receiver 120 converts an analog signal of the load voltage $V_{L1}$ into the first load digital signal $D_{L1}$.

The timing device 140 dynamically adjusts the first adjustment code RT1code and the second adjustment code RT2code according to the first contact digital signal DC1, the first terminate digital signal DTX1 and the first load digital signal DL1. The first adjustment code RT1code and the second adjustment code RT2code can adjust the impedance of the first variable resistor RTX1 and the impedance of the second variable resistor RTX2 according to a look up table. The first adjustment code RT1code and the second adjustment code RT2code can also adjust the impedance of the first variable resistor RTX1 and the impedance of the second variable resistor RTX2 according to an iterative method. For example, a number of bits of the first adjustment code RT1code and the second adjustment code RT2code is 6, the first contact digital signal DC1, the first terminate digital signal DTX1 and the first load digital signal DL1 with digital codes of 0~63 are converted by the first receiver 120 according to the first contact voltage VC1, the first terminate voltage VTX1 and the first load voltage VL1. The impedance calibration device 1 dynamically adjusts the impedance of the first variable resistor RTX1 and the impedance of the second variable resistor RTX2 according to the look up table or the iterative method to make the first terminate digital signal DTX1 equal a sum of the first contact digital signal DC1 and the first load digital signal DL1 so as to achieve an impedance match. It would be optimal to have the first contact digital signal DC1 and the first load digital signal DL1 respectively equal half of the first terminate digital signal DTX1.

Figure 2:
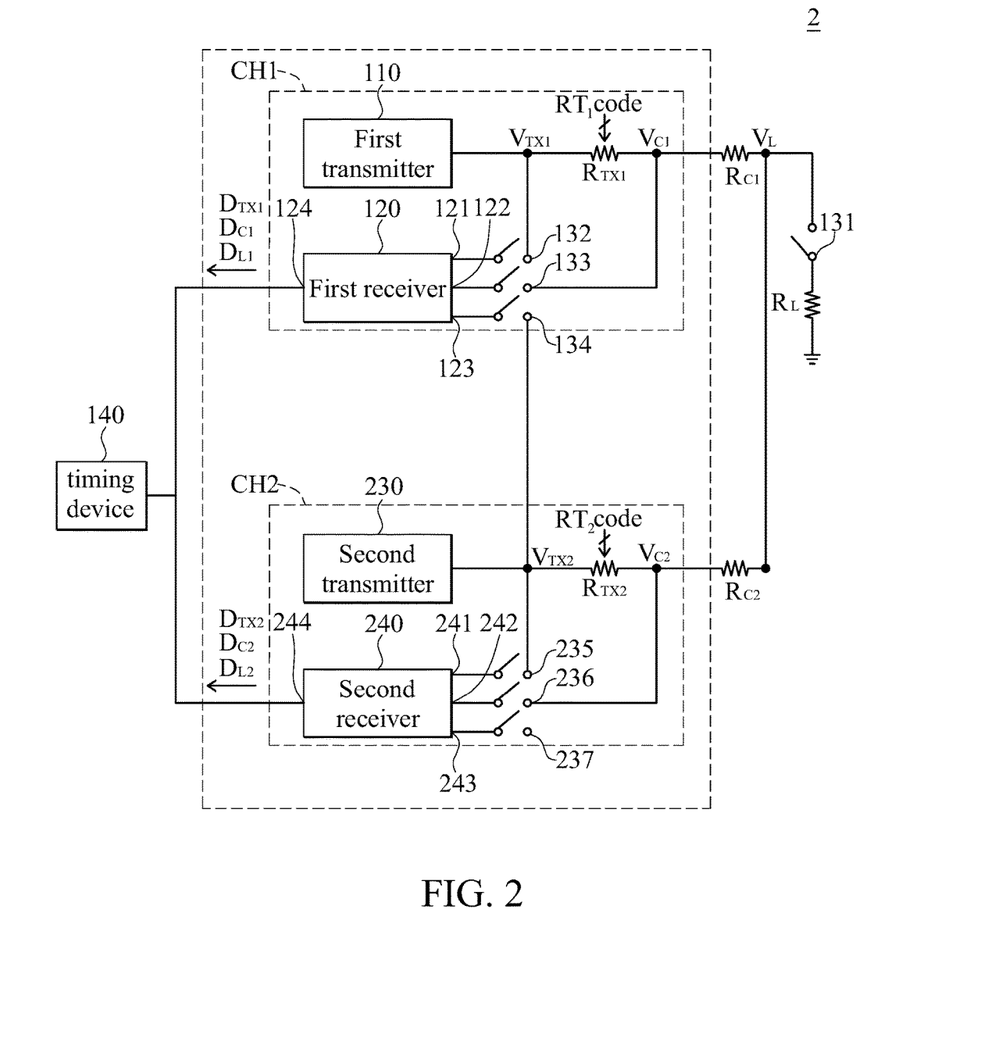
FIG. 2 shows a circuit diagram of another impedance calibration device according to the embodiment of the present disclosure.

Reference is made to FIG. 2, which shows a circuit diagram of another impedance calibration device according to the embodiment of the present disclosure. The impedance calibration device 2 includes the first transmitter 110, the first receiver 120, the first switch 131, the second switch 132, the third switch 133, the fourth switch 134, a fifth switch 235, a sixth switch 236, a seventh switch 237, the first variable resistor RTX1, the second variable resistor RTX2, the first the contact resistor RC1, the load resistor RL, the timing device 140, a second transmitter 230, a second receiver 240 and a second contact resistor RC2. The second receiver 240 further includes a fourth input terminal 241, a fifth input terminal 242, a sixth input terminal 243 and a second output terminal 244. The impedance calibration device 2 has a second channel CH2. Details of the first transmitter 110, the first receiver 120, the first switch 131, the second switch 132, the third switch 133, the fourth switch 134, the first variable resistor RTX1 and the first the contact resistor RC are shown by the embodiment of FIG. 1 and will be omitted herein.

The timing device 140 is coupled to the first channel CH1 and the second channel CH2, and used to input different timing codes to respectively control the first adjustment code RT1code and the second adjustment code RT2code, the timing device 140 controls the first channel CH1 and the second channel CH2 to operate at different times. Furthermore, when the fourth switch 134 is enabled, and the second switch 132 and the third switch 133 are opened, the first receiver 120 generates the first load digital signal D L1 according to the load voltage VL and the second adjustment code RT2code. Then, a sampling performed in the first channel CH1 to the first load digital signal DL1 needs to be based on the second adjustment code RT2code. In other words, the sampling performed in the first channel CH1 to the first load digital signal D L1 needs to use the second adjustment code RT2code of the second variable resistor RTX2 in the second channel CH2. Therefore, in a range of time of sampling performed to each digital signal in the first channel CH1, the second transmitter 230 and the second receiver 240 in the second channel CH2 may be regarded as being open.

The second contact resistor $R_{C2}$ has an end coupled to an uncoupled end of the second variable resistor $R_{TX2}$, and an uncoupled end used for being coupled to the load resistor $R_L$. The fourth input terminal 241 is coupled to an end of the fifth switch 235, and an uncoupled end of the fifth switch 235 is connected to a second terminate voltage $V_{TX2}$. The fifth input terminal 242 is used for being coupled to an end of the sixth switch 236, and an uncoupled end of the sixth switch 236 is connected to a second contact voltage $V_{C2}$. The sixth input terminal 243 is used for being coupled to an end of the seventh switch 237, and an uncoupled end of the seventh switch 237 is coupled to the first channel CH1.

When the sixth switch 236 is enabled, and the fifth switch 235 and the seventh switch 237 are opened, the second receiver 240 generates the second contact digital signal $D_{C2}$ according to the second contact voltage $V_{C2}$. When the sixth switch 236 is enabled, and a first switch 313, the fifth switch 235 and the seventh switch 237 are opened, the first switch 131 is opened to form an open circuit with the load resistor $R_L$. The second adjustment code $RT_2$code may adjust an impedance of the second variable resistor $R_{TX2}$ to be 0, at which time the second terminate voltage VTx2 equals the second contact voltage $V_{C2}$, the sixth switch 236 of the second receiver 240 is connected to the second terminate voltage $V_{TX2}$, the second receiver 240 generates the second terminate digital signal $D_{TX2}$ according to the second terminate voltage $V_{TX2}$ and the second adjustment code $RT_2$code.

When the fifth switch 235 is enabled, and the first switch 131, the sixth switch 236 and the seventh switch 237 are opened, the first switch 131 is opened to form an open circuit with the load resistor RL. The second adjustment code RT2code can adjust the impedance of the second variable resistor RTX2 to be 0. At this time, the second terminate voltage VTX2 equals the second contact voltage VC2 and the load voltage VL, and the fifth switch 235 of the second receiver 240 is connected to the load voltage VL. The second receiver 240 generates a second load digital signal DL2 according to the load voltage VL and the second adjustment code RT2code. The timing device 140 dynamically adjusts the second adjustment code RT2code according to the second contact digital signal DC2, a second terminate digital signal DTX2 and the second load digital signal DL2.

Figure 3:
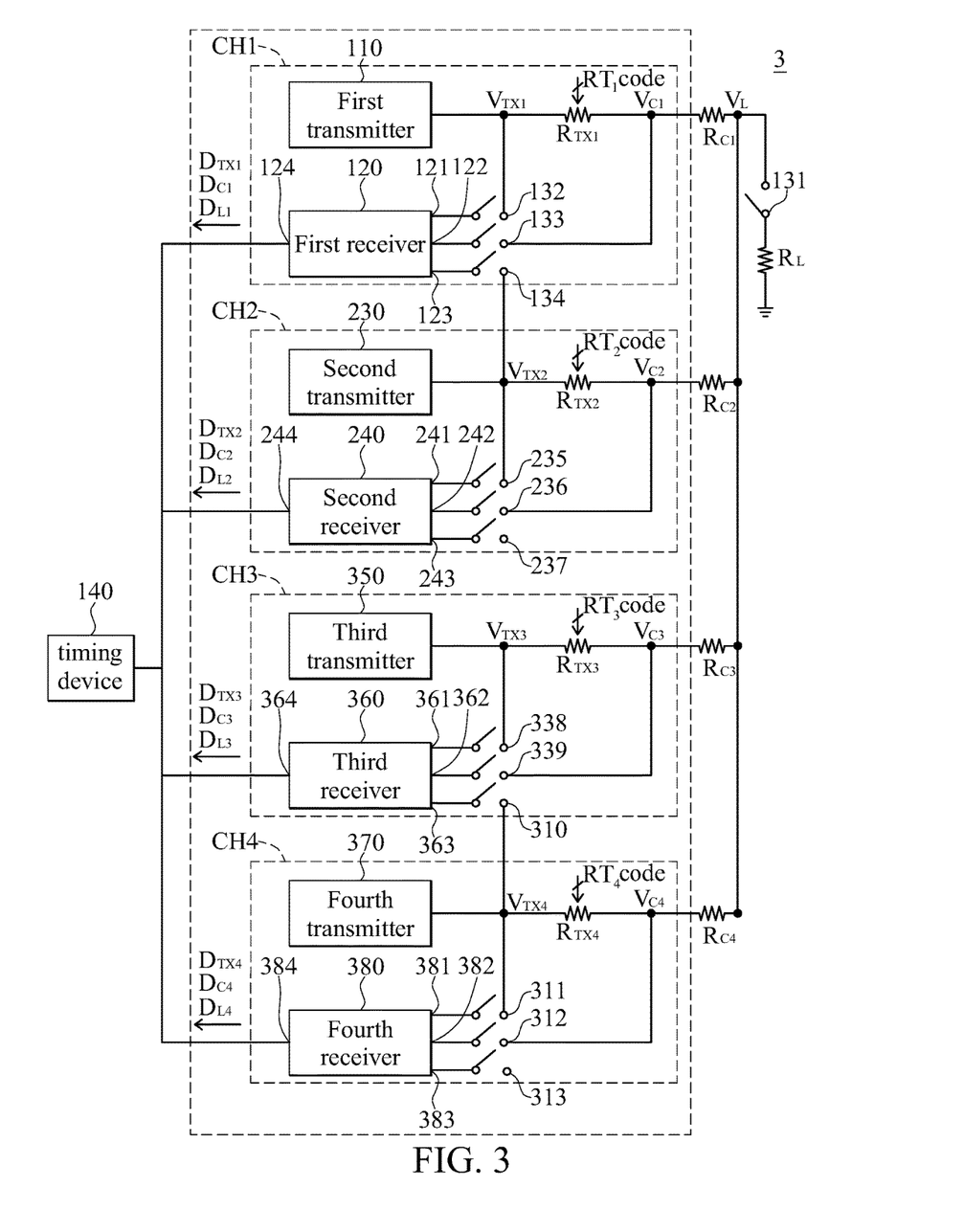
FIG. 3 shows a circuit diagram of yet another impedance calibration device according to the embodiment of the present disclosure.

Reference is made to FIG. 3, which shows a circuit diagram of yet another impedance calibration device according to the embodiment of the present disclosure. An impedance calibration device 3 includes the timing device 140, the first channel CH1, the second channel CH2, a third channel CH3 and a fourth channel CH4. The first channel CH1, the second channel CH2, the third channel CH3 and the fourth channel CH4 are respectively coupled to the timing device 140, and receive the timing code transmitted from the timing device 140. Details on the first channel CH1 and the second channel CH2 are shown by the embodiments of FIG. 1 and FIG. 2 and will be omitted herein. The impedance calibration device 3 further includes a third transmitter 350, a third variable resistor RTX3, a third contact resistor RC3, a third receiver 360, a fourth transmitter 370, a fourth variable resistor RTX4, the fourth contact resistor RC4 and the load resistor RL. The third receiver 360 has a seventh input terminal 361, an eighth input terminal 362, a ninth input terminal 363 and a third output terminal 364. A fourth receiver 380 has a tenth input terminal 381, an eleventh input terminal 382, a twelfth input terminal 383 and a fourth output terminal 384.

The third variable resistor $R_{TX3}$ has an end coupled to the third transmitter 350, an end of the third variable resistor $R_{TX3}$ is connected to a third terminate voltage $V_{TX3}$. The third variable resistor $R_{TX3}$ is used to receive a third adjustment code $RT_3$code, the third adjustment code $RT_3$code is used to adjust a resistance of the third variable resistor $R_{TX3}$. The third contact resistor $R_{C3}$ has an end coupled to an uncoupled end of the third variable resistor $R_{TX3}$, the third contact resistor $R_{C3}$ has an end connected to a third contact voltage $V_{C3}$, and an uncoupled end of the third contact resistor $R_{C3}$ is used for being coupled to the load resistor $R_L$. The seventh input terminal 361 is used for being coupled to an end of an eighth switch 338, an uncoupled end of the eighth switch 388 is connected to the third terminate voltage $V_{TX3}$. The eighth input terminal 362 is used for being coupled to an end of a ninth switch 339, an uncoupled end of the ninth switch 339 is connected to the third contact voltage $V_{C3}$, and the ninth input terminal 363 is used for being coupled to an end of a tenth switch 310. The fourth variable resistor $R_{TX4}$ has an end used for being coupled to an uncoupled end of the tenth switch 310, and the fourth variable resistor $R_{TX4}$ is used to receive a fourth adjustment code $RT_4$code.

When the ninth switch 339 is enabled, and the eighth switch 338 and the tenth switch 310 are opened, the third receiver 360 generates a third contact digital signal $D_{C3}$ according to the third contact voltage $V_{C3}$. When the ninth switch 339 is enabled, and the first switch 131, the eighth switch 338 and the tenth switch 310 are opened, the first switch 131 is opened to form an open circuit with the load resistor $R_L$, the third adjustment code $RT_3$code can adjust an impedance of the third variable resistor $R_{TX3}$ to be 0, at which time the third terminate voltage $V_{TX3}$ equals the third contact voltage $V_{C3}$, and the third receiver 360 generates a third terminate digital signal $D_{TX3}$ according to the third terminate voltage $V_{TX3}$ and the third adjustment code $RT_3$code.

When the tenth switch 310 is enabled, and the eighth switch 338 and the ninth switch 339 are opened, the fourth adjustment code RT4code can adjust an impedance of the fourth variable resistor RTX4 to be 0, and the third receiver 360 generates a third load digital signal DL3 according to the load voltage VL and the fourth adjustment code RT4code. The timing device 140 dynamically adjusts the third adjustment code RT3code and the fourth adjustment code RT4code according to the third contact digital signal DC3, the third terminate digital signal DTX3 and the third load digital signal DL3. Furthermore, when the impedance calibration is performed in the first channel CH1, the second channel CH2 is regarded as being opened. When the impedance calibration is performed in the third channel CH3, the fourth channel CH4 is regarded as being open. Therefore, the timing device 140 may control the first channel CH1 and the third channel CH3 to operate at the same time.

The fourth transmitter 370 is coupled to an end of the fourth variable resistor $R_{TX4}$. A fourth contact resistor $R_{C4}$ has an end coupled to an uncoupled end of the fourth variable resistor $R_{TX4}$, and an uncoupled end of the fourth contact resistor $R_{C4}$ is used for being coupled to the load resistor $R_L$. The tenth input terminal 381 is used for being coupled to an end of an eleventh switch 311, and an uncoupled end of the eleventh switch 311 is connected to a fourth terminate voltage $V_{TX4}$. The eleventh input terminal 382 is used for being coupled to an end of a twelfth switch 312, and an uncoupled end of the twelfth switch 312 is connected to a fourth contact voltage $V_{C4}$. The twelfth input terminal 383 is used for being coupled to an end of a thirteenth switch 313, and an uncoupled end of the thirteenth switch 313 is coupled to the third channel CH3.

When the twelfth switch 312 is enabled, and the eleventh switch 311 and the thirteenth switch 313 are opened, the fourth receiver 380 generates a fourth contact digital signal DC4 according to the fourth contact voltage VC4. When the twelfth switch 312 is enabled, and the first switch 131, the eleventh switch 311 and the thirteenth switch 313 are opened, the fourth receiver 380 generates a fourth terminate digital signal DTX4 according to the fourth terminate voltage VTX4 and the fourth adjustment code RT4code. When the eleventh switch 311 is enabled, and the first switch 131, the twelfth switch 312 and the thirteenth switch 313 are opened, the fourth receiver 380 generates a fourth load digital signal DL4 according to the load voltage VL and the fourth adjustment code RT4code. The timing device 140 dynamically adjusts the fourth adjustment code RT4code according to the fourth contact digital signal DC4, the fourth terminate digital signal DTX4 and the fourth load digital signal DL4.

Figure 4:
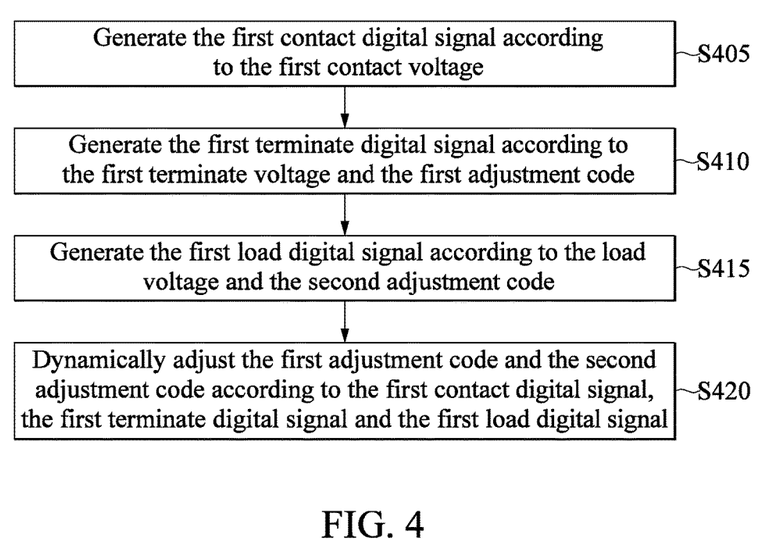
FIG. 4 shows a flowchart of an impedance calibration method according to the embodiment of the present disclosure.

Reference is made to FIG. 1 and FIG. 4, the latter of which shows a flowchart of an impedance calibration method according to an embodiment of the present disclosure. In step S405, the first receiver 120 generates the first contact digital signal $D_{C1}$ according to the first contact voltage $V_{C1}$ of the first the contact resistor $R_{C1}$. In step S410, the first receiver 120 generates the first terminate digital signal $D_{TX1}$ according to the first terminate voltage $V_{TX1}$ of the first variable resistor $R_{TX1}$ and the first adjustment code $RT_1$code. In step S415, the first receiver 120 generates the first load digital signal $D_L$ according to the load voltage $V_L$ of the load resistor $R_L$ and the second adjustment code $RT_2$code. In step S420, the timing device 140 dynamically adjusts the first adjustment code $RT_1$code and the second adjustment code $RT_2$code according to the first contact digital signal $D_{C1}$, the first terminate digital signal $D_{TX1}$ and the first load digital signal $D_{L1}$.

When the third switch 133 is enabled, and the second switch 132 and the fourth switch 134 are opened, the first receiver 120 generates and outputs the first contact digital signal $D_{C1}$ to the first output terminal 124 according to the first contact voltage $V_{C1}$. When the third switch 133 is enabled, and the first switch 131, the second switch 132 and the fourth switch 134 are opened, the first receiver 120 generates the first terminate digital signal $D_{TX1}$ according to the first terminate voltage $V_{TX1}$ and the first adjustment code $RT_1$code. When the fourth switch 134 is enabled, and the second switch 132 and the third switch 133 are opened, the first receiver 120 generates the first load digital signal $D_{L1}$ according to the load voltage $V_L$ and the second adjustment code $RT_2$code. The first adjustment code $RT_1$code and the second adjustment code $RT_2$code can adjust the impedance of the first variable resistor $R_{TX1}$ and the impedance of the second variable resistor $R_{TX2}$ according to the look up table. The first adjustment code $RT_1$code and the second adjustment code $RT_2$code can also adjust the impedance of the first variable resistor $R_{TX1}$ and the impedance of the second variable resistor $R_{TX2}$ according to the iterative method.

Figure 5:
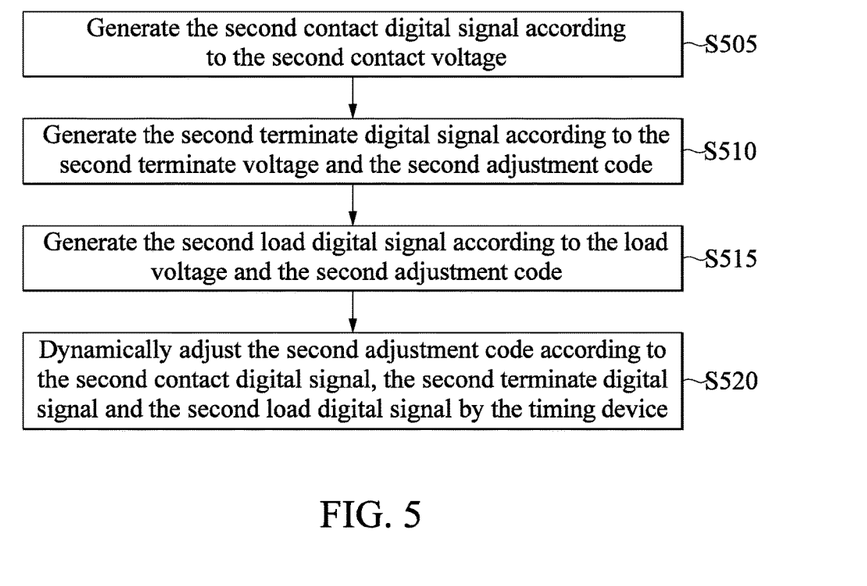
FIG. 5 shows a flowchart of another impedance calibration method according to the embodiment of the present disclosure.

Reference is made to FIG. 2 and FIG. 5, the latter of which shows a flowchart of another impedance calibration method according to the embodiment of the present disclosure. In step S505, the second receiver 240 generates the second contact digital signal DC2 according to the second contact voltage VC2 of the second contact resistor RC2. In step S510, the second receiver 240 generates the second terminate digital signal DTX2 according to the second terminate voltage VTX2 of the second variable resistor RTX2 and the second adjustment code RT2code. In step S515, the second receiver 240 generates the second load digital signal DL2 according to the load voltage VL of the load resistor RL and the second adjustment code RT2code. In step S520, the timing device 140 dynamically adjusts the second adjustment code RT2code according to the second contact digital signal DC2, the second terminate digital signal DTX2 and the second load digital signal DL.

Figure 6:
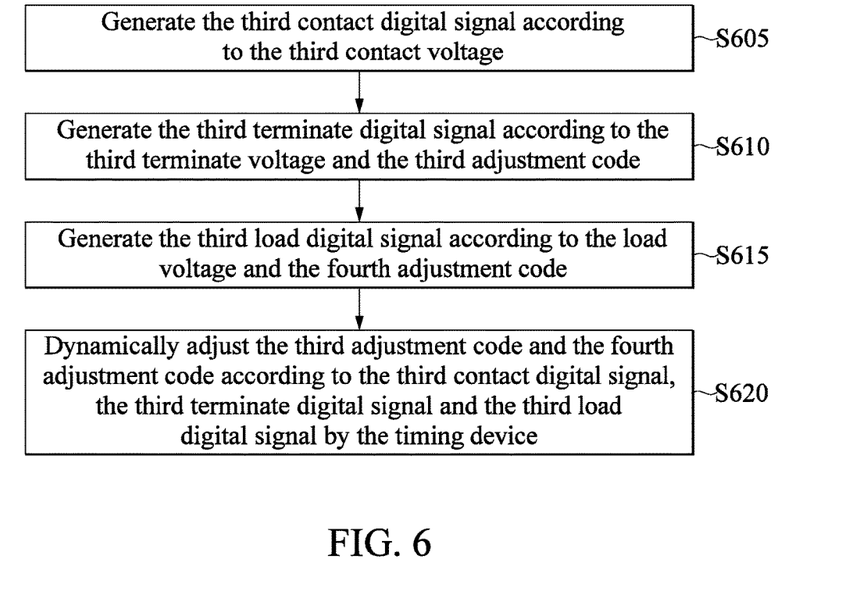
FIG. 6 shows a flowchart of yet another impedance calibration method according to the embodiment of the present disclosure.

Reference is made to FIG. 3 and FIG. 6, the latter of which shows a flowchart of yet another impedance calibration method according to the embodiment of the present disclosure. In step S605, the third receiver 360 generates the third contact digital signal DC3 according to the third contact voltage VC3 of the third contact resistor RC3. In step S610, the third receiver 360 generates the third terminate digital signal DTX3 according to the third terminate voltage VTX3 of the third variable resistor RTX3 and the third adjustment code RT3code. In step S615, the third receiver 360 generates the third load digital signal DL3 according to the load voltage VL of the load resistor $R_L$ and the fourth adjustment code RT4code. In step S620, the timing device 140 dynamically adjusts the third adjustment code RT3code and the fourth adjustment code RT4code according to the third contact digital signal DC3, the third terminate digital signal DTX3 and the third load digital signal DL3. The timing device 140 controls the first channel CH1 and the third channel CH3 to operate at the same time.

Figure 7:
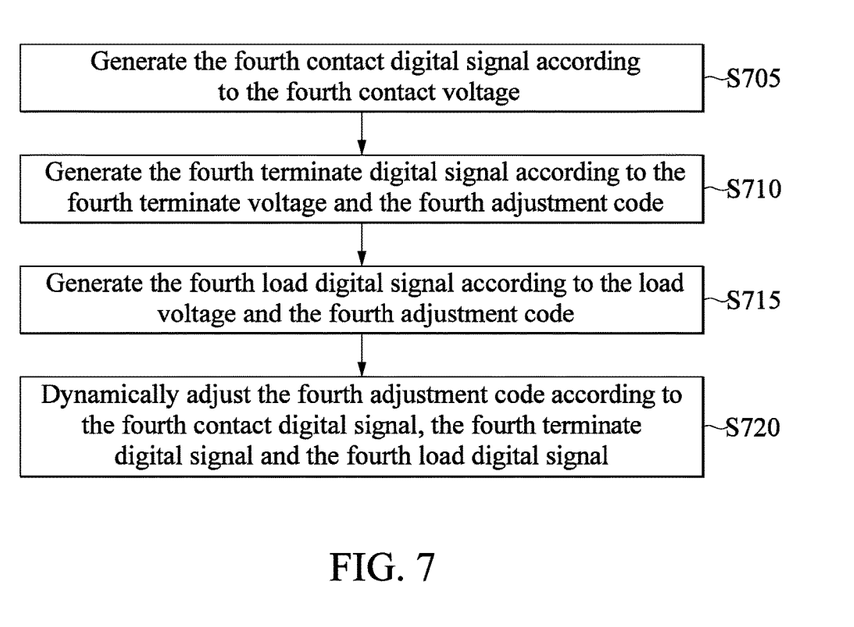
FIG. 7 shows a flowchart of still another impedance calibration method according to the embodiment of the present disclosure.

Reference is made to FIG. 3 and FIG. 7, the latter of which shows a flowchart of still another impedance calibration method according to the embodiment of the present disclosure. In step S705, the fourth receiver 380 generates the fourth contact digital signal DC4 according to the fourth contact voltage VC4 of the fourth contact resistor RC4. In step S710, the fourth receiver 380 generates the fourth terminate digital signal DTX4 according to the fourth terminate voltage VTX4 of the fourth variable resistor RTX4 and the fourth adjustment code RT$_4$code. In step S715, the fourth receiver 380 generates the fourth load digital signal DL4 according to the load voltage V$_L$ of the load resistor R$_L$ and the fourth adjustment code RT4code. In step S720, the timing device 140 dynamically adjusts the fourth adjustment code RT4code according to the fourth contact digital signal DC4, the fourth terminate digital signal DTX4 and the fourth load digital signal DL4.

In summary, the present disclosure provides the impedance calibration device using an automatic impedance calibration method to achieve an impedance match. The adjustment code is inputted to the variable resistor to adjust the impedance of the variable resistor, and the optimized combination can be found by the look up table or the iterative method to make the terminate digital signal equal to the sum of the contact digital signal and the load digital signal for matching the impedance. The present disclosure provides the impedance calibration device adapted to an analog front-end circuit, and the impedance calibration device converts the analog signal into the digital signal to find a difference or a proportion of the impedances. The present disclosure requires only a few hardware elements, such as a switch, to automatically calibrate the impedance and reduce manufacturing costs.

The aforementioned descriptions merely represent the preferred embodiments of the present disclosure, without any intention to limit the scope of the present disclosure which is fully described only within the following claims. Various equivalent changes, alterations or modifications based on the claims of the present disclosure are all, consequently, viewed as being embraced by the scope of the present disclosure.

What is claimed is:

1. An impedance calibration device having a timing device, a first channel, a first switch, a first contact resistor and a load resistor, the timing device being coupled to the first channel, the load resistor having an end coupled to an end of the first switch, the load resistor having an uncoupled end connected to ground, the first switch having an uncoupled end coupled to an end of the first contact resistor and the first switch having a load voltage, the impedance calibration device comprising:
a first transmitter;
a first variable resistor having an end coupled to the first transmitter and having a first terminate voltage, the first variable resistor being used to receive a first adjustment code, the first contact resistor having an uncoupled end coupled to an uncoupled end of the first variable resistor and having a first contact voltage; and
a first receiver having a first input terminal, a second input terminal, a third input terminal and a first output terminal, the first input terminal being coupled to an end of a second switch, the second switch having an uncoupled end connected to the first terminate voltage, the second input terminal being coupled to an end of a third switch, the third switch having an uncoupled end connected to the first contact voltage, the third input terminal being coupled to an end of a fourth switch;
wherein a second variable resistor has an end coupled to an uncoupled end of the fourth switch, and the second variable resistor receives a second adjustment code;
wherein the first receiver generates a first contact digital signal according to the first contact voltage, the first receiver generates a first terminate digital signal according to the first terminate voltage and the first adjustment code, the first receiver generates a first load digital signal according to the load voltage and the second adjustment code, and the timing device dynamically adjusts the first adjustment code and the second adjustment code according to the first contact digital signal, the first terminate digital signal and the first load digital signal.

2. The impedance calibration device of claim 1, wherein when the first receiver generates the first contact digital signal according to the first contact voltage, the third switch is enabled, and the second, fourth switch are opened.

3. The impedance calibration device of claim 1, wherein when the first receiver generates the first terminate digital signal according to the first terminate voltage and the first adjustment code, the third switch is enabled, and the first switch, the second switch, and the fourth switch are opened.

4. The impedance calibration device of claim 1, wherein when the first receiver generates the first load digital signal according to the load voltage and the second adjustment code, the fourth switch is enabled, and the second, third switches are opened.

5. The impedance calibration device of claim 1, wherein the first adjustment code and the second adjustment code are used to adjust an impedance of the first variable resistor and an impedance of the second variable resistor according to a look up table.

6. The impedance calibration device of claim 1, wherein the first adjustment code and the second adjustment code are used to adjust an impedance of the first variable resistor and an impedance of the second variable resistor according to an iterative method.

7. The impedance calibration device of claim 1, having a second channel and a second contact resistor, the second contact resistor having an end coupled to an uncoupled end of the second variable resistor, the second contact resistor having an uncoupled end being coupled to the load resistor, the timing device being coupled to the second channel, the timing device controlling the first channel and the second channel to operate at different times, the impedance calibration device further comprising:
a second transmitter; and
a second receiver having a fourth input terminal, a fifth input terminal, a sixth input terminal and a second output terminal, the fourth input terminal being coupled to an end of a fifth switch, the fifth switch having an end connected to a second terminate voltage, the fifth input terminal being coupled to an end of a sixth switch, the sixth switch having an uncoupled end connected to a second contact voltage, the sixth input terminal being coupled to an end of a seventh switch, the seventh switch having an uncoupled end coupled to a first channel;
wherein the second receiver generates a second contact digital signal according to the second contact voltage, the second receiver generates a second terminate digital signal according to the second terminate voltage and the second adjustment code, the second receiver generates a second load digital signal according to the load voltage and the second adjustment code, and the timing device dynamically adjusts the second adjustment code according to the second contact digital signal, the second terminate digital signal and the second load digital signal.

8. The impedance calibration device of claim 7, having a third channel and a third contact resistor, the third contact resistor having an end coupled to the load resistor, the timing device being coupled to the third channel, the impedance calibration device further comprising:
  a third transmitter;
  a third variable resistor having an end coupled to the third transmitter and having a third terminate voltage, the third variable resistor being used to receive a third adjustment code, the third contact resistor having an uncoupled end coupled to an uncoupled end of the third variable resistor and having a third contact voltage;
  a third receiver having a seventh input terminal, an eighth input terminal, a ninth input terminal and a third output terminal, the seventh input terminal being coupled to an end of an eighth switch, the eighth switch having an uncoupled end connected to the third terminate voltage, the eighth input terminal being coupled to an end of a ninth switch, the ninth switch having an uncoupled end connected to the third contact voltage, the ninth input terminal being coupled to an end of a tenth switch; and
  wherein a fourth variable resistor has an end being coupled to an uncoupled end of the tenth switch, and the fourth variable resistor is used to receive a fourth adjustment code;
  wherein the third receiver generates a third contact digital signal according to the third contact voltage, the third receiver generates a third terminate digital signal according to the third terminate voltage and the third adjustment code, the third receiver generates a third load digital signal according to the load voltage and the fourth adjustment code, and the timing device dynamically adjusts the third adjustment code and the fourth adjustment code according to the third contact digital signal, the third terminate digital signal and the third load digital signal; and the timing device controls the first channel and the third channel to operate at the same time.

9. The impedance calibration device of claim 8, having a fourth channel and a fourth contact resistor, the fourth contact resistor having an end coupled to an uncoupled end of the fourth variable resistor, the fourth contact resistor having an uncoupled end being coupled to the load resistor, the timing device being coupled to the fourth channel, the impedance calibration device further comprising:
  a fourth transmitter coupled to an end of the fourth variable resistor; and
  a fourth receiver having a tenth input terminal, an eleventh input terminal, a twelfth input terminal and a fourth output terminal, the tenth input terminal being coupled to an end of a eleventh switch, the eleventh switch having an uncoupled end connected to a fourth terminate voltage, the eleventh input terminal being coupled to an end of a twelfth switch, the twelfth switch having an uncoupled end connected to a fourth contact voltage, the twelfth input terminal being coupled to an end of a thirteenth switch, and the thirteenth switch having an uncoupled end coupled to a third channel;
  wherein the fourth receiver generates a fourth contact digital signal according to the fourth contact voltage, the fourth receiver generates a fourth terminate digital signal according to the fourth terminate voltage and the fourth adjustment code, the fourth receiver generates a fourth load digital signal according to the load voltage and the fourth adjustment code, and the timing device dynamically adjusts the fourth adjustment code according to the fourth contact digital signal, the fourth terminate digital signal and the fourth load digital signal.

10. An impedance calibration method used for a impedance calibration device having a first channel, the impedance calibration device including a timing device, a first receiver, a first variable resistor, a second variable resistor, a first contact resistor, a load resistor and a first transmitter, the first variable resistor being used to receive a first adjustment code, the second variable resistor being used to receive a second adjustment code, the first receiver having a first input terminal, a second input terminal, a third input terminal and a first output terminal, the timing device being coupled to the first channel, the first input terminal being coupled to an end of a second switch, the second switch having an uncoupled end connected to a first terminate voltage, the second input terminal being coupled to an end of a third switch, the third switch having an uncoupled end connected to the first contact voltage, the third input terminal being coupled to an end of a fourth switch, the impedance calibration method comprising:
  the first receiver generating a first contact digital signal according to the first contact voltage of the first contact resistor;
  the first receiver generating a first terminate digital signal according to the first terminate voltage of the first variable resistor and the first adjustment code;
  the first receiver generating a first load digital signal according to a load voltage of the load resistor and the second adjustment code; and
  the timing device dynamically adjusting the first adjustment code and the second adjustment code according to the first contact digital signal, the first terminate digital signal and the first load digital signal.

11. The impedance calibration method of claim 10, wherein when the first receiver generates the first contact digital signal according to the first contact voltage, the third switch is enabled, and the second, fourth switch are opened.

12. The impedance calibration method of claim 10, wherein when the first receiver generates the first terminate digital signal according to the first terminate voltage and the first adjustment code, the third switch is enabled, and the first switch, the second switch, and the fourth switch are opened.

13. The impedance calibration method of claim 10, wherein when the first receiver generates the first load digital signal according to the load voltage and the second adjustment code, the fourth switch is enabled, and the second, third switches are opened.

14. The impedance calibration method of claim 10, wherein the first adjustment code and the second adjustment code are used to adjust an impedance of the first variable resistor and an impedance of the second variable resistor according to a look up table.

15. The impedance calibration method of claim 10, wherein the first adjustment code and the second adjustment code are used to adjust an impedance of the first variable resistor and an impedance of the second variable resistor according to an iterative method.

16. The impedance calibration method of claim 10, the impedance calibration device including a second transmitter, a second contact resistor and a second receiver and a second channel, the timing device being coupled to the second channel, the timing device controlling the first channel and the second channel to operate at different times, the impedance calibration method further comprising:

the second receiver generating a second contact digital signal according to a second contact voltage of the second contact resistor;

the second receiver generating a second terminate digital signal according to a second terminate voltage of the second variable resistor and the second adjustment code;

the second receiver generating a second load digital signal according to the load voltage of the load resistor and the second adjustment code; and the timing device dynamically adjusting the second adjustment code according to the second contact digital signal, the second terminate digital signal and the second load digital signal.

17. The impedance calibration method of claim 16, the impedance calibration device including a third transmitter, a third variable resistor, a third contact resistor, a third receiver, a fourth variable resistor and a third channel, the timing device being coupled to the third channel, the third variable resistor being used to receive a third adjustment code, the fourth variable resistor being used to receive a fourth adjustment code, the impedance calibration method further comprising:

the third receiver generating a third contact digital signal according to a third contact voltage of the third contact resistor;

the third receiver generating a third terminate digital signal according to a third terminate voltage of the third variable resistor and the third adjustment code;

the third receiver generating a third load digital signal according to the load voltage of the load resistor and the fourth adjustment code; and the timing device dynamically adjusting the third adjustment code and the fourth adjustment code according to the third contact digital signal, the third terminate digital signal and the third load digital signal;

wherein the timing device controls the first channel and the third channel to operate at the same time.

18. The impedance calibration method of claim 17, the impedance calibration device including a fourth transmitter, a fourth contact voltage, a fourth receiver and a fourth channel, the timing device being coupled to the fourth channel, the impedance calibration method further comprising:

the fourth receiver generating a fourth contact digital signal according to a fourth contact voltage of the fourth contact resistor;

the fourth receiver generating a fourth terminate digital signal according to a fourth terminate voltage of the fourth variable resistor and the fourth adjustment code;

the fourth receiver generating a fourth load digital signal according to the load voltage of the load resistor and the fourth adjustment code; and the timing device dynamically adjusting the fourth adjustment code according to the fourth contact digital signal, the fourth terminate digital signal and the fourth load digital signal.

* * * * *